US006538587B1

(12) United States Patent
Chuang

(10) Patent No.: US 6,538,587 B1
(45) Date of Patent: Mar. 25, 2003

(54) ANALOG TO DIGITAL CONVERTING DEVICE WITH MULTIPLE CHANNELS

(76) Inventor: Tsan-Huang Chuang, 7F-8, No. 77, Sec. 1, Hsin-Tai-Wu Rd., Hsi-Chih City, Taipei Hsien (TW)

(*) Notice: Subject to any disclaimer, the term of this patent is extended or adjusted under 35 U.S.C. 154(b) by 0 days.

(21) Appl. No.: 10/001,063

(22) Filed: Nov. 27, 2001

(51) Int. Cl.[7] ................................................ H03M 1/00
(52) U.S. Cl. ...................... 341/137; 341/118; 341/155; 341/120; 341/156; 341/110; 341/126
(58) Field of Search ........................ 341/110–112, 137, 341/155, 126, 142, 118, 120, 156

(56) References Cited

U.S. PATENT DOCUMENTS

| | | | | |
|---|---|---|---|---|
| 4,137,451 A | * | 1/1979 | Einolf, Jr. ............... | 250/231.13 |
| 5,046,158 A | * | 9/1991 | Groen ........................ | 341/137 |
| 5,706,007 A | * | 1/1998 | Fragnito et al. ............ | 341/156 |
| 5,724,035 A | * | 3/1998 | Sakuma ....................... | 341/116 |
| 6,118,396 A | * | 9/2000 | Song ........................... | 341/137 |
| 6,313,637 B1 | * | 11/2001 | Iino et al. ................... | 324/434 |

* cited by examiner

*Primary Examiner*—Michael Tokar
*Assistant Examiner*—Linh Van Nguyen
(74) *Attorney, Agent, or Firm*—Belasco Jacobs & Townsley, LLP; David A. Belasco

(57) ABSTRACT

An analog to digital converting device has a photo-coupled switching device that is composed of a plurality of input channels, and each input channel is composed of a pair of photo relays, wherein each photo relay is controlled by an A/D converting module to be turned on/off. Since the photo relay has high impedance, the isolation between two adjacent channels is enhanced, and possible damage from an interference voltage that occurs across two adjacent channels is avoided.

1 Claim, 3 Drawing Sheets

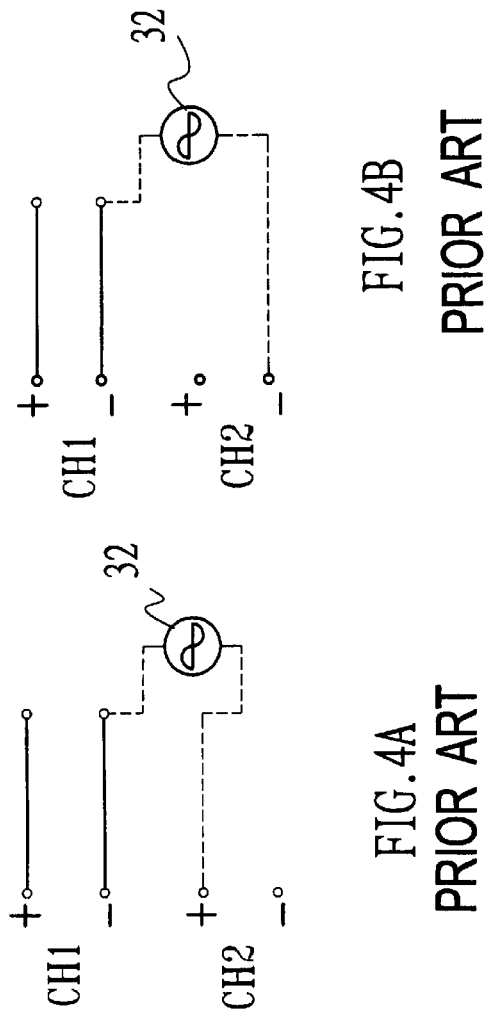
FIG. 4B PRIOR ART
FIG. 4A PRIOR ART
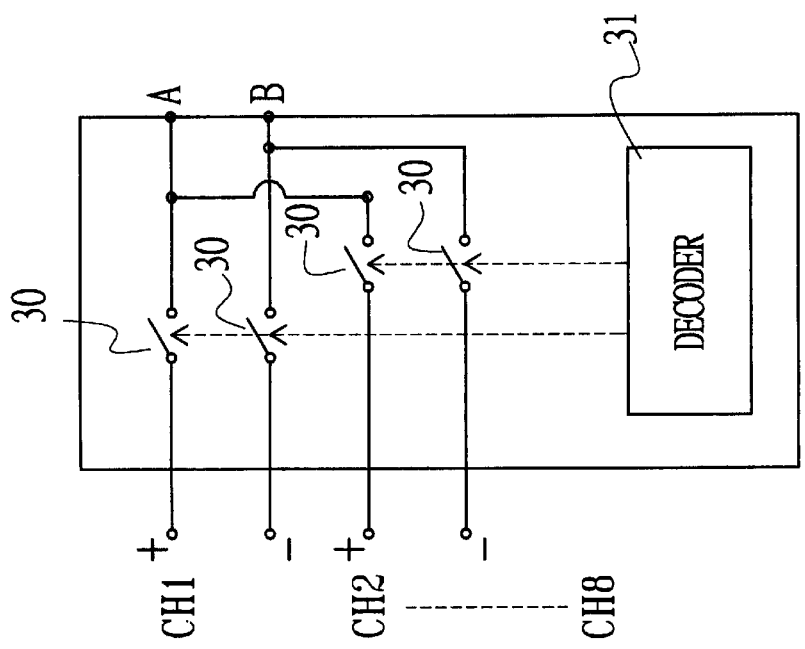
FIG. 3 PRIOR ART

ANALOG TO DIGITAL CONVERTING DEVICE WITH MULTIPLE CHANNELS

BACKGROUND OF THE INVENTION

1. Field of Invention

The present invention relates to an analog to digital converting device, and more particularly to an analog to digital converting device that has a plurality of photo relays to form multiple input channels, since the impedance of the photo relay is extremely high, the isolation effect between two input channels is improved and possible damage to the channels caused by high voltage is avoided.

2. Related Art

In an operating system, analog signals often need to be converted into digital signals firstly, whereby the operating system can analyze and process the digital signals. Thus an analog to digital converter acts as an important element. Conventionally, the A/D converter uses a multiplex switch to select one of multiple analog signal, and then the A/D converter converts the selected analog signal into a digital form.

The multiplex switch is an essential element acting as a signal switching device. With reference to FIG. 3, a conventional multiplex switch has several input channels (CH1–CH8), and each input channel (CH1–CH8) has a positive and a negative input terminal. Both the positive and the negative input terminal are respectively connected to two common output terminals (A, B) through an analog switch (30). A decoder (31) is provided to control the multiple analog switches (30) to turn on/off. When the decoder (31) triggers the analog switches (30) in the channel 1 (CH1) to simultaneously turn on, the signals inputted from the channel 1 (CH1) are able to conduct to the common output signals (A, B), meanwhile the remaining channels (CH2≧CH8) are all cut off.

However, a poor isolation problem exists in the conventional multiplex switch. With reference to FIGS. 4A and 4B, if the channel 1 (CH1) is activated and the remaining channels (only channel 2 is shown) are cut off, once an undesired interference voltage (32) is inducted across channel 1 (CH1) and channel 2 (CH2), since the impedance of the analog switches (30) in the channel 1 (CH1) and channel 2 (CH2) are not high enough to bear the interference voltage (32), both the channel 1 (CH1) and channel 2 (CH2) are easy to be broken by the high potential of the interference voltage (32). The interference voltage (32) may occur because of many factors, such as static interference among the channels, lightning or electromagnetic interference.

To overcome the shortcomings, the present invention tends to provide an A/D converting device so as to mitigate and obviate the aforementioned problems.

SUMMARY OF THE INVENTION

An objective of the invention is to provide an analog to digital converting device that has a photo-coupled switching device, the switch has multiple input channels and each input channel has two photo relays acting as switching elements, and because of the high impedance of each photo relay, the isolation between two adjacent input channels is enhanced whereby possible damage from the interference voltage is avoided.

Other objects, advantages and novel features of the invention will become more apparent from the following detailed description when taken in conjunction with the accompanying drawings.

BRIEF DESCRIPTION OF THE DRAWINGS

FIG. 3 illustrates a conventional multiplex switch; and

FIGS. 4A and 4B illustrate the conventional multiplex switch of FIG. 3 is interfered by an interference voltage.

DETAILED DESCRIPTION OF THE INVENTION

Figure 1:
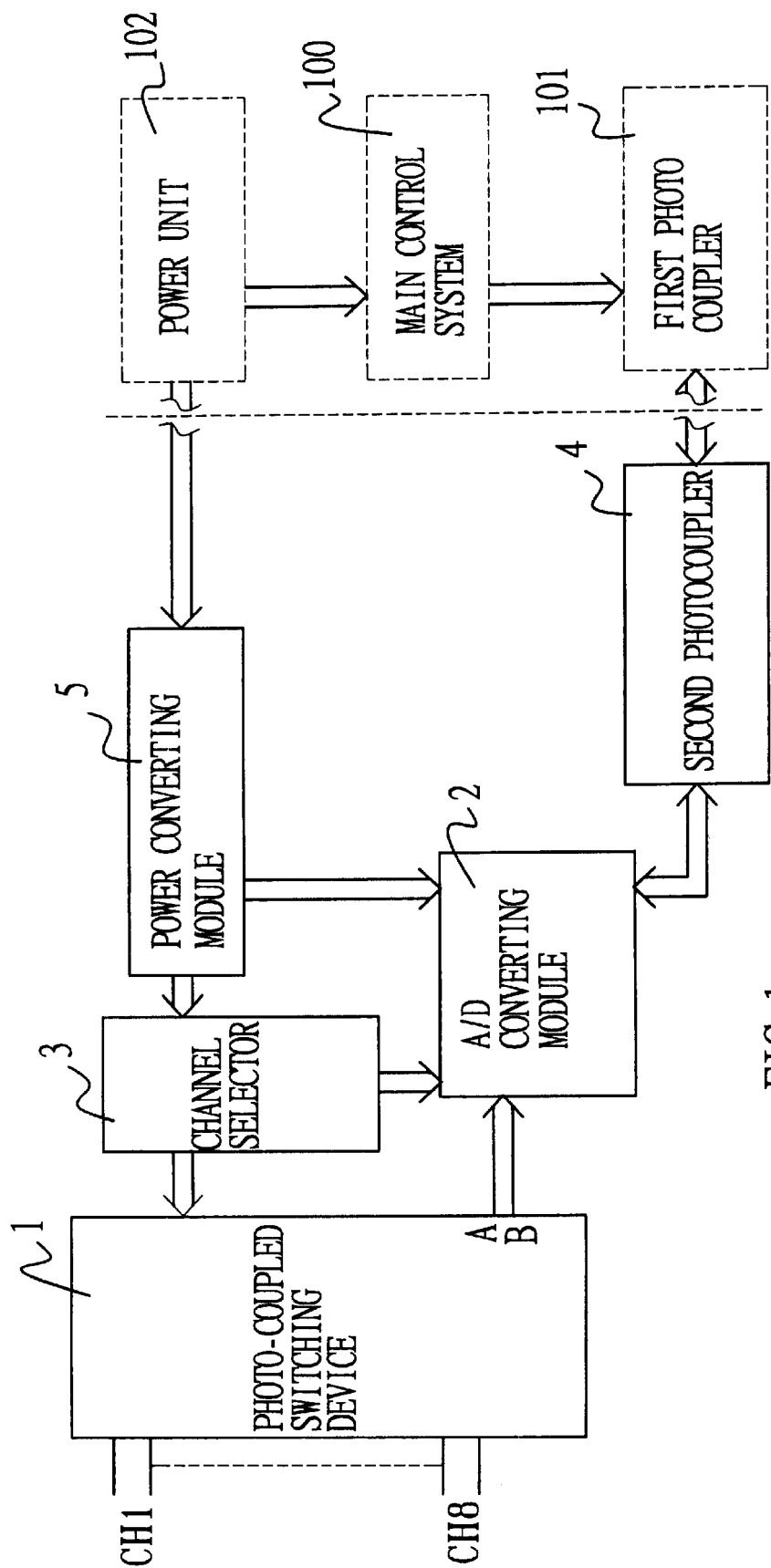
FIG. 1 illustrates a block diagram of an A/D converting device in accordance with the present invention.

With reference to FIG. 1, an analog to digital converter (A/D converter) of the present invention is operated in coordination with a main control system (100) that obtains operation voltage from a power unit (102), wherein the main control system (100) communicates with the A/D converter via a first photocoupler (101).

The A/D converter of the invention comprises an analog to digital converting unit module (2), a channel selector (3) connected between the A/D converting module (2) and a photo-coupled switching device (1), a power converting unit (5) connected to the A/D converting module (2) and receiving operation voltage from the power unit (102), and a second photocoupler (4) connected to the A/D converting module (2) to communicate with the first photocoupler (101).

The signal transmission between the A/D converter of the invention and the main control system (100) is achieved via the first photocoupler (101) and the second photocoupler (4), whereby the EMI caused from the main control system is able to be reduced.

Figure 2:
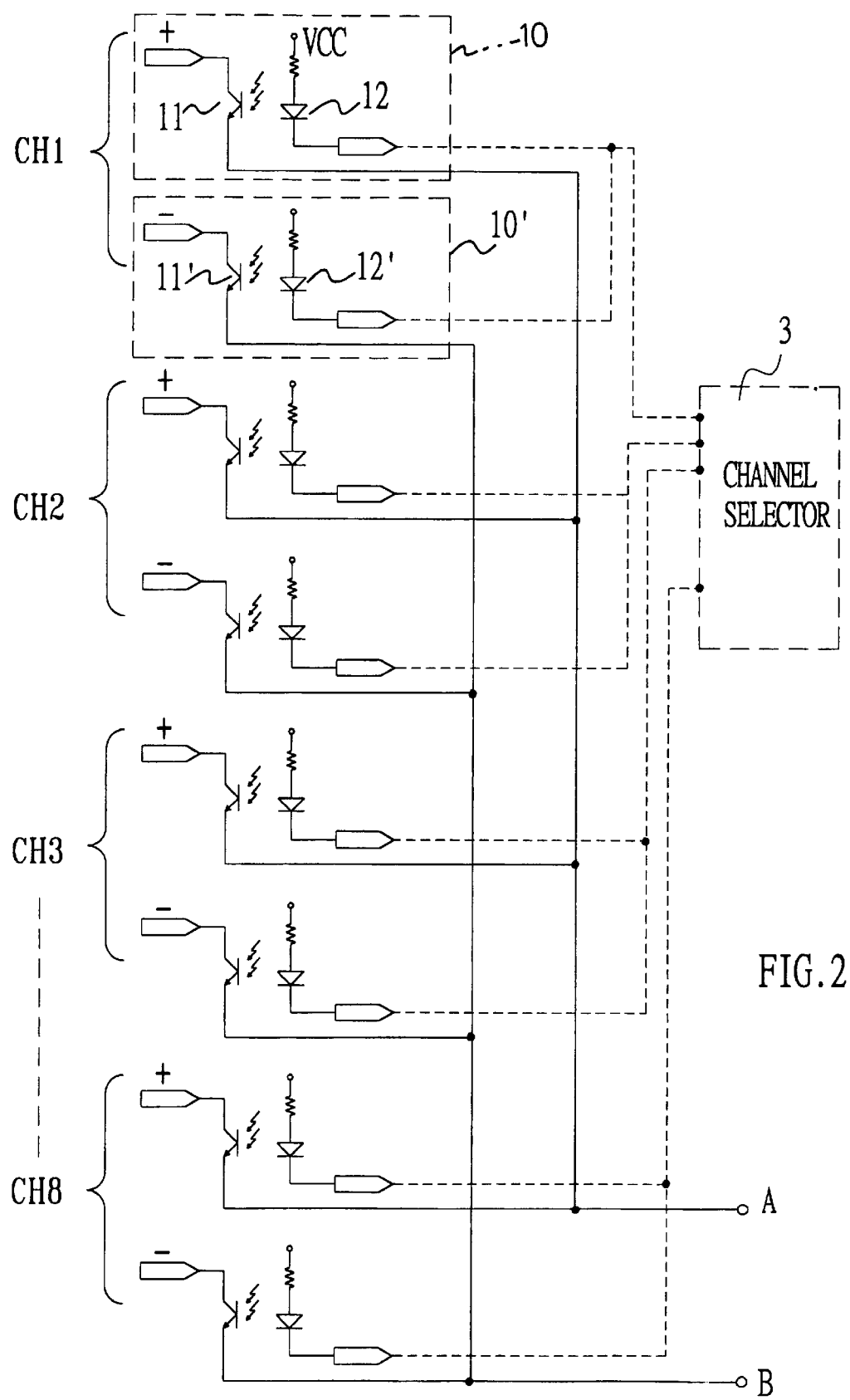
FIG. 2 illustrates a photo-coupled switching device in accordance with the present invention.

With reference to FIG. 2, the photo-coupled switching device (1) in accordance with the present invention has multiple input channels, wherein there are eight channels (CH1–CH8) in this embodiment and those input channels respectively receive different signals. Each input channel (CH1–CH8) has a positive terminal (denoted with symbol "+") and a negative input terminal (denoted with symbol "−"), wherein both the positive and negative terminals are composed of a photo relay (10) (10').

Since the photo relays (10)(10') in each input channel (CH1–CH8) are the same, only the first photo relay (10) and the second photo relay (10') in channel 1 (CH1) are interpreted hereinafter. The first photo relay (10) comprises a photo field effect transistor (FET) (11) and a light emitting diode (LED) (12) corresponding to the FET (11). A collector terminal of the photo FET (11) is used as the positive signal input terminal, and an emitter terminal is connected to a common output terminal (A). A positive terminal of the LED (12) is connected to a power source (VCC) through a resistor, and a negative terminal of the LED (12) is controlled by the channel selector (3).

The second photo relay (10') is substantially the same as the first photo relay (10), wherein the second photo relay (10') also comprises a photo FET (11') and an LED (12'). The collector terminal of the photo FET (11') acts as the negative input terminal, and the emitter terminal of the photo FET (11') is connected to another common output terminal (B). The positive terminal of the LED (12') is also connected to the power through a resistor and the negative terminal of the LED (12') is also controlled by the channel selector (3).

With reference to FIGS. 1 and 3, if the input signal of channel 1 (CH1) is intended to output from the common output terminals (A, B), the A/D converting module (2) outputs a low voltage control signal through the channel selector (3) simultaneously to the negative terminals of the LEDs (12) (12'), whereby the two LEDs (12) (12') are in conduction and emit light. Once the two photo FETs (11) (11') correspondingly receive the light from the LEDs (12) (12'), the two photo FETs (11) (11') are activated and thus the signals from the positive and negative input terminals are able to conduct to the common output terminals (A, B). Then the analog signal from channel 1 (CH1) is converted into the digital signal by the A/D converting module (2), and the digital signal is transmitted to the main control system (100) through the first photocoupler (4) and the second photocoupler (101).

Since the impedance of the photo FET (11)(11') is higher than 1000 mega-olhms in the cut-off status, a good isolation effect is provided between two adjacent channels, and the voltage toleration between two channels is able to reach to 350 volts.

The invention may be varied in many ways by a skilled person in the art. Such variations are not to be regarded as a departure from the spirit and scope of the invention, and all such modifications are intended to be included within the scope of the following claims.

What is claimed is:

1. An analog to digital converting device comprising:
   an analog to digital converting module;
   a photo-coupled switching device having output terminals connected to the analog to digital converting module, wherein the photo-coupled switching device has multiple input channels, and each input channel receives an analog signal;
   wherein each of the multiple input channels is composed of a first photo relay and a second photo relay, wherein the first photo relay comprises:
      a first photo field effect transistor (FET) having a first collector terminal used as a positive input terminal and having a first emitter terminal connected to a first common output terminal; and
      a first light emitting diode (LED) having a first positive terminal connected to a power source and having a first negative terminal controlled by the analog to digital converting module; wherein the second photo relay comprises:
      a second photo field effect transistor (FET) having a second collector terminal used as a negative input terminal and having a second emitter terminal connected to a second common output terminal; and
      a second light emitting diode (LED) having a second positive terminal connected to a power source and having a second negative terminal controlled by the analog to digital converting module;
   whereby when the analog to digital converting module outputs a control signal to trigger the first LED and the second LED to be activated, light emitting from the first LED and the second LED further activates the first photo FET and the second photo FET, so that a signal at the positive and the negative input terminals is passed to the first and the second common output terminals;
   a channel selector is connected between the analog to digital converting module and the photo-coupled switching device;
   a first photocoupler connected with the analog to digital converting module and adapted to couple to a second photocoupler of a control system; and
   a power converting module providing an operating voltage to the analog to digital converting module;
   wherein the analog to digital converting module selects a first channel of the multiple input channels and converts an analog signal of the first channel into a digital signal, and then the digital signal is transferred to the control system via the first photocoupler.

* * * * *